United States Patent
Katoch et al.

(10) Patent No.: US 9,324,412 B2
(45) Date of Patent: Apr. 26, 2016

(54) MEMORY ARCHITECTURE

(71) Applicants: Atul Katoch, Kanata (CA); Mayank Tayal, Ottawa (CA)

(72) Inventors: Atul Katoch, Kanata (CA); Mayank Tayal, Ottawa (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 111 days.

(21) Appl. No.: 13/791,025

(22) Filed: Mar. 8, 2013

(65) Prior Publication Data

US 2014/0119138 A1 May 1, 2014

Related U.S. Application Data (60) Provisional application No. 61/720,777, filed on Oct. 31, 2012.

(51) Int. Cl.
*G11C 7/22* (2006.01)
*G11C 11/419* (2006.01)
*G11C 7/08* (2006.01)
*G11C 7/12* (2006.01)

(52) U.S. Cl.
CPC .............. *G11C 11/419* (2013.01); *G11C 7/08* (2013.01); *G11C 7/12* (2013.01)

(58) Field of Classification Search
USPC ............. 365/189.14, 189.15, 189.16, 189.02, 365/154
See application file for complete search history.

(56) References Cited

U.S. PATENT DOCUMENTS

| | | | | |
|---|---|---|---|---|
| 5,168,467 | A * | 12/1992 | Fukushi | 365/189.06 |
| 5,438,551 | A * | 8/1995 | Sakata | 365/233.5 |
| 5,986,967 | A * | 11/1999 | Furumochi et al. | 365/233.1 |
| 7,839,704 | B2 * | 11/2010 | Murata | 365/189.16 |
| 7,881,130 | B2 * | 2/2011 | Koga | 365/189.14 |
| 7,894,287 | B2 * | 2/2011 | Kim | 365/210.12 |
| 7,995,413 | B2 * | 8/2011 | Genevaux et al. | 365/210.11 |
| 8,369,413 | B2 * | 2/2013 | Yeh et al. | 375/240.25 |
| 2011/0007557 | A1 * | 1/2011 | Niki et al. | 365/154 |

* cited by examiner

*Primary Examiner* — Hoai V Ho
*Assistant Examiner* — Minh Dinh
(74) *Attorney, Agent, or Firm* — Hauptman Ham, LLP (57) ABSTRACT

A memory circuit includes a memory cell and a data circuit. In a write operation of the memory cell, the data circuit is configured to provide a first write logical value to the first output of the data circuit and to provide a second write logical value to the second output of the data circuit. The first write logical value is different from the second write logical value. In a read operation of the memory cell, the data circuit is configured to provide a same logical value to the first output and the second output of the data circuit.

20 Claims, 5 Drawing Sheets

MEMORY ARCHITECTURE

FIELD

The present disclosure is related to a memory architecture.

BACKGROUND

In a static random access memory (SRAM) circuit, two bit lines are coupled with a memory cell, and each bit line corresponds to a write mux transistor. In a read operation, the two write mux transistors are turned off, but draw some leakage current. Further, a sense amplifier is used to sense a bit line split of the two bit lines that reflects the data read from the memory cell. In some existing approaches, during a read operation, the data difference at each of the write mux transistors increases the effective offset of the sense amplifier and causes the sense amplifier to take a longer time to provide a sensed result.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. During a read operation of a memory cell, a sense amplifier is used to sense data on bit lines of a memory circuit. Data at two write mux transistors have a same logical value. As a result, an effective offset of the sense amplifier is reduced, and the sense amplifier is able to sense a bit line split that is smaller than a bit line split in another approach. Effectively, a sense or read speed of the sense amplifier is improved. The bit lines are also able to receive a write driver larger than a write driver of another approach. As a result, the write speed is improved and/or the cycle time is reduced.

Memory Circuit

Figure 1A:
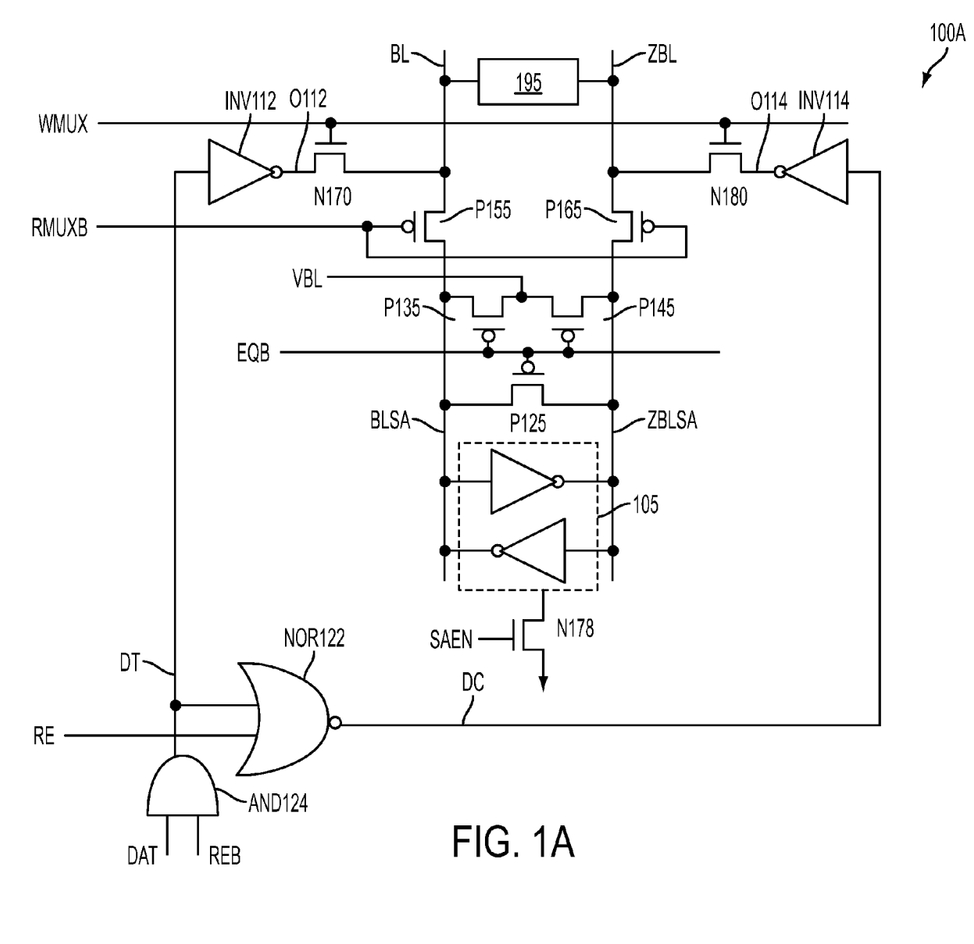
FIG. 1A is a diagram of a memory circuit, in accordance with some embodiments.

FIG. 1A is a diagram of a memory circuit 100A, in accordance with some embodiments. Memory circuit 100A is a static random access memory (SRAM) circuit. Other types of memory are within the scope of various embodiments.

A signal EQB and PMOS transistors P125, P135, and P145 are used to pre-charge and equalize bit lines BLSA and ZBLSA. Signal EQB is at gates of transistors P125, P135, and P145. Sources of transistors P125 and P145 are coupled with bit lines BLSA and ZBLSA, respectively. Drains of transistors P135 and P145 are coupled together and are configured to receive a voltage VBL. A drain and a source of transistor P125 are coupled with bit lines BLSA and ZBLSA, respectively. When signal EQB is applied with a low logical value, transistors P125, P135, and P145 are turned on. As a result, bit lines BLSA and ZBLSA are at a same voltage level of voltage VBL. In some embodiments, voltage VBL is at a supply voltage VDD value. Stated differently, bit lines BLSA and ZBLSA are pre-charged and equalized to a value of supply voltage VDD. Other values of voltage VBL are within the scope of various embodiments. PMOS transistors P125, P135, and P145 used to pre-charge and equalize bit lines BLSA and ZBLSA are for illustration. Other circuits and/or other types of transistors, such as NMOS transistors, used to pre-charge and equalize bit lines BLSA and ZBLSA are within the scope of various embodiments.

Bit lines BL and ZBL serve as both data input and output for a memory cell 195. In some embodiments, in a write operation, applying a logical value to a first bit line and the opposite logical value to the other bit line enables writing the logical values at the bit lines to memory cell 195. A voltage difference between bit line BL and bit line ZBL is called a bit line split. In a read operation, sensing a bit line split of bit lines BL and ZBL reveals the data stored in memory cell 195. In some embodiments, in a read operation, bit lines BL and ZBL are electrically coupled with corresponding bit lines BLSA and ZBLSA. As a result, sensing a bit line split of bit lines BLSA and ZBLSA is the same as sensing a bit line split of bit lines BL and ZBL. In other words, sensing a bit line split of bit lines BLSA and ZBLSA also reveals the data stored in memory cell 195.

Sense amplifier 105 is used to sense or read the data stored in memory cell 195 through a bit line split of bit lines BLSA and ZBLSA. When a bit line split of bit lines BLSA and ZBLSA is sufficiently developed, sense amplifier 105 is turned on to sense or amplify the bit line split and generate a full swing signal on bit lines BLSA and ZBLSA that, through bit lines BL and ZBL, represent the data read from memory cell 195.

A signal SAEN and an NMOS transistor N178 are used to turn on and off sense amplifier 105. For example, when signal SAEN at a gate of NMOS transistor N178 is logically low, NMOS transistor 178 is turned off and functions as an open circuit. Effectively, sense amplifier 105 is turned off. In contrast, when signal SAEN is logically high, NMOS transistor N178 is turned on, and serves as a current path for sense amplifier 105. Effectively, sense amplifier 105 is turned on.

A signal RMUXB and PMOS transistors P155 and P165 are used to switch between a read operation and a write operation of memory circuit 100. Gates of transistors P155 and 165 are coupled together and receive signal RMUXB. Drains of transistors P155 and P165 are coupled with bit lines BL and ZBL, respectively. Sources of transistors P155 and P165 are coupled with bit lines BLSA and ZBLSA, respectively.

In a read operation, signal RMUXB is logically low to turn on transistors P155 and P165. As a result, bit lines BL and ZBL are electrically coupled with corresponding bit lines BLSA and ZBLSA. Sense amplifier 105 is turned on to sense the data stored in a memory cell 195 that has been reflected on bit lines BL and ZBL and corresponding bit lines BLSA and ZBLSA. In contrast, in a write operation, when signal RMUXB is logically high, transistors P155 and P165 are turned off and function as an open circuit. As a result, bit lines BL and ZBL are electrically disconnected from bit lines BLSA and ZBLSA and from sense amplifier 105. The data placed on bit lines BL and ZBL are then written into memory cell 195. PMOS transistors P155 and P165 being used to switch between a write and a read operation are for illustration. Other switching circuits, switching devices, NMOS transistors, etc., used to switch between a write and a read operation are within the scope of various embodiments.

A signal WMUX and NMOS transistors N170 and N180 serve to transfer write data DAT at an input of an AND gate AND124 to bit lines BL and ZBL, respectively. Inverters INV112 and INV114 are each called a driver. Transistors N170 and N180 are each called a write mux transistor. An input of inverter INV112 is coupled with an output of an AND gate AND124, and receives data DT at the output of AND gate AND124. An input of inverter INV114 is coupled with an output of a NOR gate NOR122, and receives data DC at the output of NOR gate NOR122. An output O112 of inverter INV112 is coupled with a drain of transistor N170, and an output O114 of inverter INV114 is coupled with a drain of transistor N180. A source of each of transistors N170 and N180 is coupled with bit lines BL and ZBL, respectively.

In a write operation, data DAT is transferred through AND gate AND124 and NOR gate NOR122 to outputs O112 and O114 of inverters INV112 and INV114. Signal WMUX at that time is applied with a high logical value to turn on NMOS transistors N170 and N180. As a result, data at outputs O112 and O114 of inverters INV112 and INV114 are transferred through transistors N170 and N180 to bit lines BL and ZBL, respectively. In contrast, in a read operation, signal WMUX is logically low, NMOS transistors N170 and N180 are turned off. As a result, bit line BL and bit lines ZBL are electrically disconnected from the write data DAT that has been transferred to outputs OUT112 and OUT114 of inverters INV112 and INV114.

Signal RE at an input of NOR gate NOR122 and signal REB at an input of AND gate AND124 have an inverse logical value of one another. Signals RE and REB, AND gate AND124, and NOR gate NOR122 serve to transfer data DAT through inverter INV112, NMOS transistor N170, and bit line BL into a first node of memory cell 195, such as node ND in FIG. 2. Similarly, signals RE and REB, AND gate AND124, and NOR gate NOR122 serve to transfer data DAT through inverter INV114, NMOS transistor N180, and bit line ZBL into a second node of memory cell 195, such as node NDB in FIG. 2.

For example, in a write operation, signal REB at an input of AND gate AND124 is logically, high. As a result, by operation of AND gate AND124, data DT at an output of AND gate AND124 has the same logical value as that of data DAT at another input of AND gate AND124. Inverter INV112 inverts data DT to provide output O112 having an inverse logical value of data DT, which is also an inverse of data DAT. Transistor N170 then transmits the inverse logical value of data DAT to bit line BL. At the same time, signal RE at an input of NOR gate NOR122 is logically low. As a result, by operation of NOR gate NOR122, data DC at an output of NOR gate NOR122 has an inverse logical value of data DT at another input of NOR gate NOR122. Inverter INV114 inverts data DC to provide output O114 having an inverse logical value of data DC, which is data DAT. Transistor N180 then transmits the inverse logical value of data DC or data DAT to bit line ZBL. In brief, in a write operation, when data DAT is to be written to memory cell 195, a logical inverse of data DAT and data DAT are placed at bit lines BL and ZBL, respectively. The data at bit lines BL and ZBL is then written into respective nodes ND and NDB of memory cell 195. Details of writing from bit lines BL and ZBL into memory cell 195 are explained with reference to FIG. 2.

In contrast, in a read operation, output O112 and output O114 have a same logical value. For example, in a read operation, signal REB is logically low. As a result, data DT is logically low regardless of a logical value of data DAT. At the same time, signal RE is logically high. As a result, data DC is logically low regardless of a logical value of data DT. Effectively, data DT and data DC have a same low logical value. Inverter INV112 inverts data DT to provide data on output O112. Inverter INV114 inverts data DC to provide data on output O114. As a result, outputs O112 and O114 have a same high logical value. Outputs O112 and O114 having a same high logical value are for illustration. Outputs O112 and O114 having a same low logical value are within the scope of various embodiments.

NOR gate NOR122, AND gate AND124, inverter INV112, and inverter INV114 are used to cause outputs O112 and O114 to have an inverse logical value of one another in a write operation and to have a same logical value in a read operation are for illustration. Other circuits performing substantially the same function of causing outputs O112 and O114 to have an inverse logical value of one another in a write operation and to have a same logical value in a read operation are within the scope of various embodiments. For example, inverters INV112 and INV114 are not used or each of inverters INV112 and INV114 is replaced by a buffer. In such a situation, in a write operation, data DAT and a logical inverse of data DAT are placed at bit lines BL and ZBL, respectively. In a read operation, however, a low logical value is placed at outputs O112 and O114. For another example, other logic gates or circuits are used in place of AND gate AND124 and/or NOR gate NOR122.

Figure 1B:
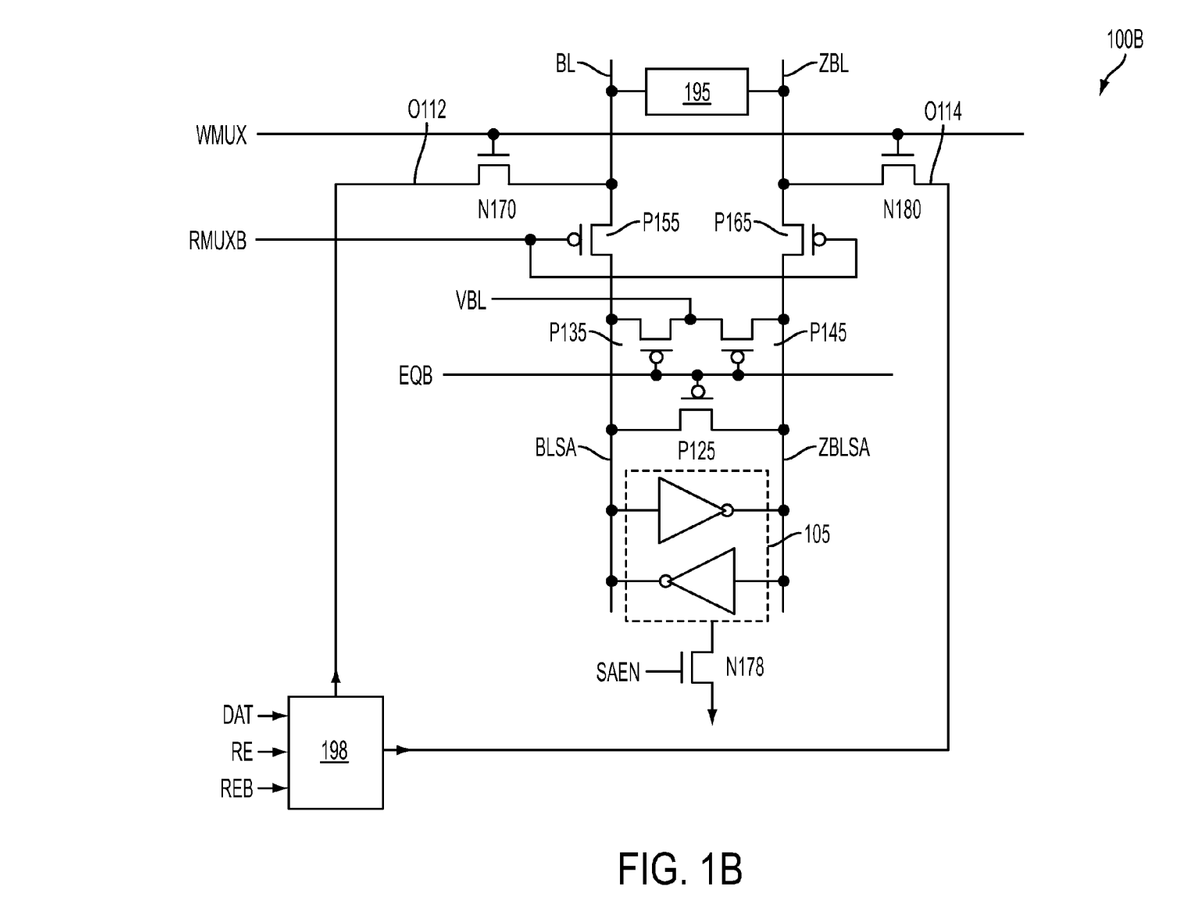
FIG. 1B is a diagram of a memory circuit, in accordance with some further embodiments.

FIG. 1B is a diagram of a memory circuit 100B, in accordance with some embodiments. Compared with circuit 100A, a circuit 198 replaces AND gate AND124, NOR gate NOR122, inverter INV112, and inverter INV114. Explained in a different way, in some embodiments, circuit 198 includes AND gate AND124, NOR gate NOR122, inverter INV112, and inverter INV114, and is configured to receive control signals RE, REB and data DAT. In some other embodiments, circuit 198 includes other circuit elements that cause outputs O112 and O114 to have an inverse logical value of one another in a write operation and to have a same logical value in a read operation are within the scope of various embodiments.

Memory Cell

Figure 2:
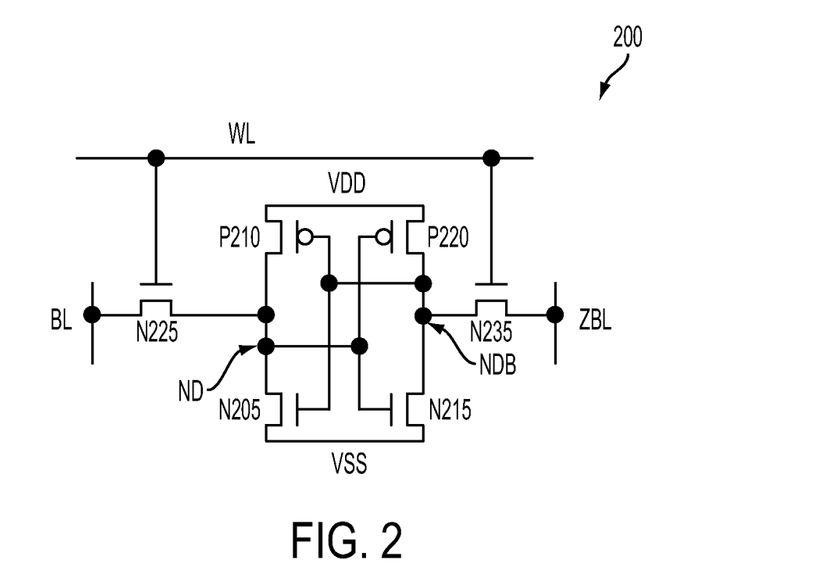
FIG. 2 is a diagram of the memory cell in FIGS. 1A and 1B, in accordance with some embodiments.

FIG. 2 is a diagram of a memory cell or memory circuit 200, in accordance with some embodiments. Memory circuit 200 is an embodiment of memory cell 195 in FIG. 1A or FIG. 1B.

Memory cell 200 includes two P-type metal oxide semiconductor (PMOS) transistors P210 and P220, and four N-type metal oxide semiconductor (NMOS) transistors N205, N215, N225, and N235. Transistors P210, P220, N205, and N215 form a cross latch. Drains of transistors P210 and N205 are coupled together and form a node ND. Drains of transistors P220 and N215 are coupled together and form a node NDB. Gates of transistors P210 and N205 are coupled together and with drains of transistors P220 and N215. Gates of transistors P220 and N215 are coupled together and with drains of transistors P210 and N205. By operations of the cross latch formed by transistors P210, P220, N205, and N215, nodes ND and NDB store a logical inverse of one another.

A word line WL is coupled with a gate of each of transistors N225 and N235 of a plurality of memory cells in a row of memory cells 200. Word line WL is also called a control line because the signal on word line WL turns and off transistors N225 and N235 for data on bit lines BL and ZBL to be transferred from and to corresponding nodes ND and NDB.

Drains of each of transistors N225 and N235 are coupled to bit lines BL and ZBL, respectively. Bit lines BL and ZBL are coupled to each drain of transistors N225 and N235 of a plurality of memory cells in a column of memory cells 200. Each of bit lines BL and ZBL is also called a data line because data carried on bit lines BL and ZBL are written to and read from corresponding nodes ND and NDB.

In a write operation of memory cell 200, in some embodiments, bit lines BL and ZBL are pre-charged to a high logical value and are then left floating with the pre-charged high logical value. Data DAT in FIG. 1 to be written to memory cell 200 is reflected on bit lines BL and ZBL. Word line WL is then activated to turn on transistors N225 and N235, which transfer the data on bit lines BL and ZBL to nodes ND and NDB.

For illustration, a high logical value of data DAT is written to node ND. As explained above with reference to FIG. 1, when data DAT has a high logical value in a write operation, bit line BL has a low logical value. When NMOS transistor N225 is turned on, if node ND stores a high logical value, node ND is pulled to a low logical value of bit line BL. If, however, node ND stores a low logical value, node ND continues to store the low logical value. In other words, node ND is written with a low logical value in both situations of node ND storing a high and a low logical value. Node ND is also at the gate of PMOS transistor P220. As a result, PMOS transistor P220 is turned on, which pulls node NDB to supply voltage VDD or a high logical value. Effectively, nodes ND and NDB are written with a low and a high logical value, respectively.

When data DAT has a low logical value, node ND is written with a high logical value, and node NDB is written with a low logical value. Operations to write node NDB with a low logical value with respect to bit line ZBL is similar to operations to write node ND with a low logical value with respect to bit line BL as explained above.

In a read operation, transistors P155 and P165 in FIG. 1A or FIG. 1B are turned on to electrically couple bit lines BL and ZBL with bit lines BLSA and ZBLSA, respectively. As a result, a reference to bit lines BL and ZBL in a read operation also refers to corresponding bit lines BLSA and ZBLSA. In other words, bit lines BL and ZBL are electrically the same as corresponding bit lines BLSA and ZBLSA in a read operation.

Further, in a read operation, bit lines BL and ZBL are pre-charged to a high logical value. Word line WL is then activated to turn on transistors N225 and N235. The data in nodes ND and NDB are therefore transferred to bit lines BL and ZBL. Based on a low logical value of the data stored in a corresponding node ND or NBD, one bit line is pulled towards a low logical value and the other bit line remains at the same pre-charged high logical value. In other words, a bit line split between bit lines BL and ZBL develops. When the bit line split is sufficiently large, sense amplifier 105 in FIG. 1 is turned on to sense the bit line split between bit lines BL and ZBL and reveals the data stored in nodes ND and NDB.

For illustration, node ND stores a low logical value, and node NDB stores a high logical value. Because bit line ZBL is logically high, node NDB via the then turned-on transistor N235 remains at the high logical value. Because node NDB is at a gate of NMOS transistor N205 and has a high logical value, NMOS transistor N205 is turned on. Because both transistors N225 and N205 are turned on, bit line BL is pulled towards voltage VSS or ground at the source of NMOS transistor N205. As bit line ZBL stays at the same high logical value and bit line BL is pulled towards a low logical value, a bit line split between bit lines BL and ZBL develops. When the bit line split is sufficiently large, sense amplifier 105 is turned on to sense the bit line split and recognizes bit line BL being pulled towards a low logical value. In other words, sense amplifier 105 recognizes that node ND stores a low logical value and node NDB therefore stores a high logical value. When node ND stores a high logical value, node NDB stores a low logical value. Sensing node ND storing a high logical value is effectively sensing node NDB storing a low logical value. Operations to sense node NDB having a low logical value with reference to NMOS transistors N235, N215 and bit line ZBL are similar to operations to sense node ND having a low logical value with reference to NMOS transistors N225, N205 and bit line BL as explained above.

In some embodiments, during a read operation, based on a high logical value of signal RE and a low logical value of signal REB, both nodes outputs O112 and O114 in FIG. 1 are at a high logical value. As a result, the bit line split between bit lines BL and ZBL is not affected by the leakage of NMOS transistors N170 and 180 which are turned off. Consequently, various embodiments of the disclosure are advantageous over other approaches in which outputs O112 and O114 have a different logical value from one another in a read operation. In the other approaches, a difference in logical value of outputs O112 and O114 causes a difference in current leakage in transistors N170 and N180. As a result, in the other approaches, the bit line split of bit lines BL and ZBL is interfered in a read operation, and sensing is degraded.

Exemplary Methods

Figure 3:
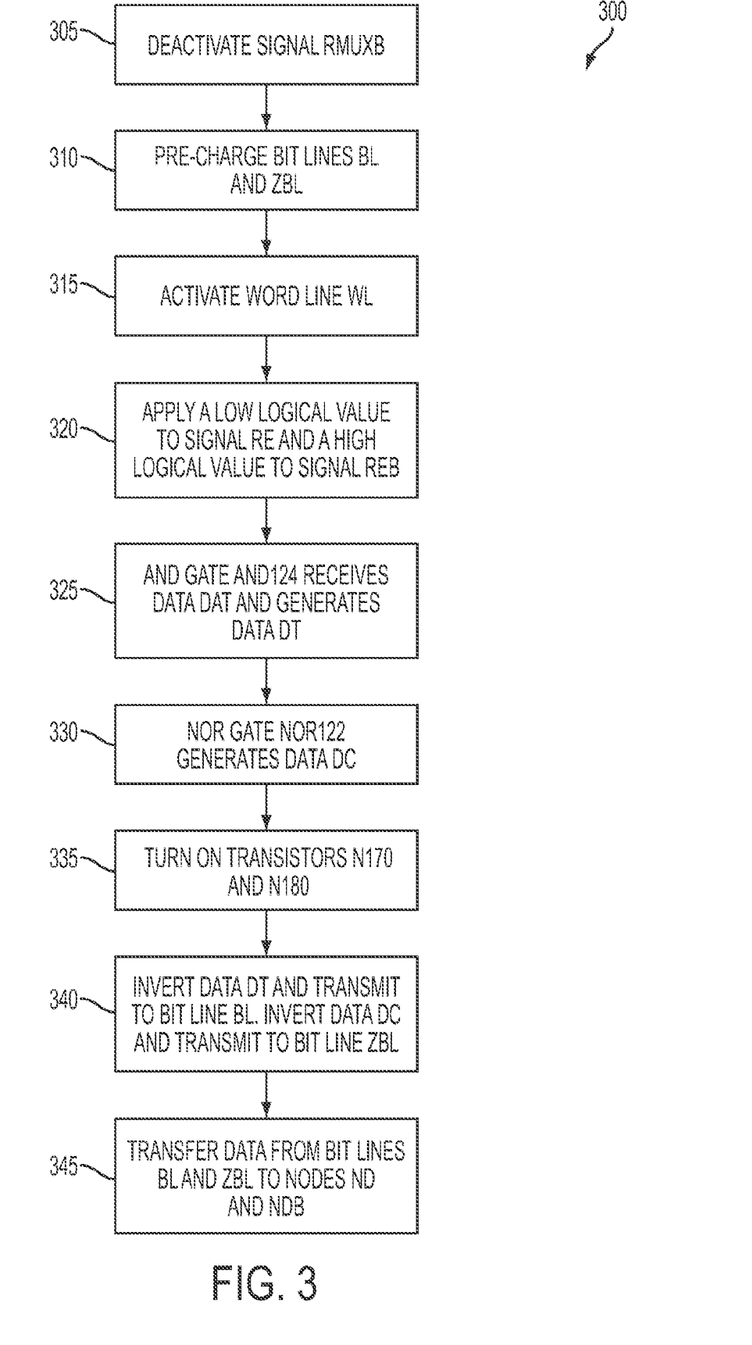
FIG. 3 is a flowchart of a method of writing data to the memory cell in FIG. 1A, in accordance with some embodiments.

FIG. 3 is a flowchart of a method 300, in accordance with some embodiments. Method 300 includes a write operation to write data DAT to memory cell 195 of memory circuit 100A. In the following operations, references are made to both FIG. 1A and FIG. 2.

In operation 305, signal RMUXB in FIG. 1A is deactivated with a high logical value to turn off transistors P155 and P165. Bit lines BL and ZBL are electrically disconnected from bit lines BLSA and ZBLSA.

In operation 310, bit lines BL and ZBL are pre-charged to a high logical value and are left floating at the pre-charged high logical value.

In operation 315, word line WL in FIG. 2 is activated with a high logical value to turn on transistors N225 and N325 in FIG. 2.

In operation 320, signal RE is applied with a low logical value and signal REB is applied with a high logical value.

In operation 325, AND gate AND124 receives data DAT, and, based on data DAT and signal REB, generates data DT that has a same logical value as that of data DAT.

In operation 330, NOR gate NOR122, based on signal RE and data DT, generates data DC that has an inverse logical value of data DT and data DAT.

In operation 335, signal WMUX is activated to turn on NMOS transistors N170 and N180.

In operation 340, inverter INV112 inverts data DT and transistor N170 transmits the inverted data DT to bit line BL. At the same time, inverter INV114 inverts data DC and transistor N180 transmits the inverted data DC to bit line ZBL. Effectively, an inverse logical value of data DAT is at bit line BL and data DAT is at bit line ZBL. For illustration, data DAT has a high logical value. As a result, a low logical value and a high logical value are at bit lines BL and ZBL, respectively.

In operation 345, NMOS transistor N225 is on at that time. If node ND already stores a low logical value, node ND continues store the same low logical value. If, however, node ND stores a high logical value, bit line BL, through transistor N224, pulls node ND to a low logical value of bit line BL. In other words, node ND is written with a low logical value regardless of the logical value already stored in node ND. Node ND is also at the gate of PMOS transistor P220. As a result, PMOS transistor P220 is turned on and pulls node NDB to supply voltage VDD or a high logical value. Effectively, nodes ND and NDB are written with a logical low and high value, respectively.

In the above illustration, when data DAT has a low logical value, in operation 340, bit lines BL and ZBL have a high and a low logical value, respectively. In operation 345, NMOS transistor N235 is on at that time and therefore transfers the low logical value of bit line ZBL to node NDB. Node NDB is also at the gate of PMOS transistor P210. As a result, PMOS transistor P210 is turned on and pulls node ND to supply voltage VDD or a high logical value. Effectively, nodes NDB and ND are written with a low and a high logical value, respectively.

Figure 4:
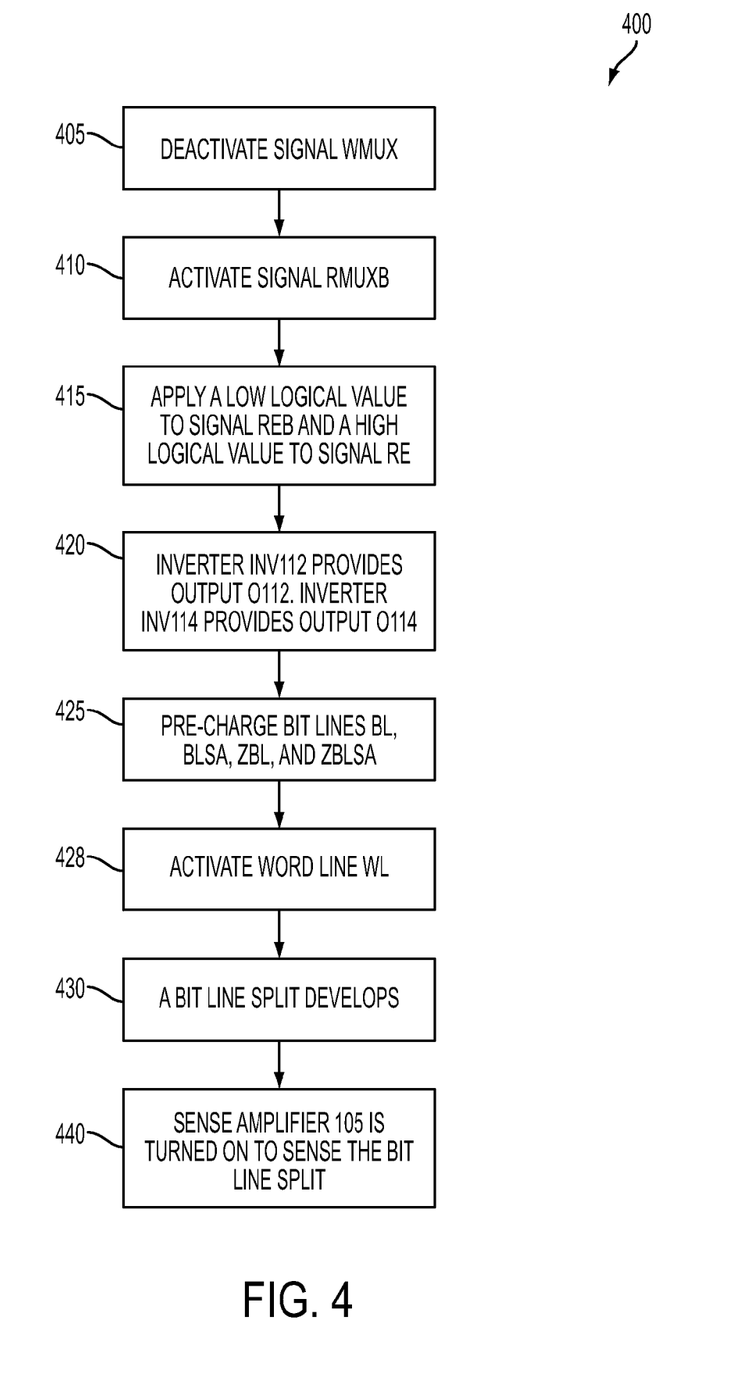
FIG. 4 is a flowchart of a method of reading or sensing data from the memory cell in FIG. 1A, in accordance with some embodiments.

FIG. 4 is a flowchart of a method 400, in accordance with some embodiments. Method 400 includes a read operation to read data from memory cell 195 of memory circuit 100A. In the following operations, references are made to both FIG. 1A and FIG. 2. For illustration, node ND in FIG. 2 stores a low logical value while node NDB stores a high logical value.

In operation 405, signal WMUX is deactivated with a low logical value to turn off transistors N170 and N180.

In operation 410, signal RMUXB is activated with a low logical value to turn on transistors P155 and P165. As a result, bit lines BL and ZBL are electrically coupled with bit lines BLSA and ZBLSA. Explained in a different way, bit lines BL and ZBL are electrically the same as corresponding bit lines BLSA and ZBLSA.

In operation 415, signal REB is applied with a low logical value. As a result, data DT is logically low regardless of a logical value of data DAT. At the same time, signal RE is applied with a high logical value. As a result, data DC is logically low regardless of a logical value of data DT.

In operation 420, inverter INV112 inverts data DT to provide a high logical value at output O112. Similarly, inverter INV114 inverts data DC to provide a high logical value at output OINV114.

In operation 425, bit lines BL, ZBL, BLSA, and ZBLSA are pre-charged with a high logical value.

In operation 428, word line WL is activated with a high logical value to turn on transistors N225 and N235.

In operation 430, node ND has a low logical value and therefore, through transistor N225, pulls bit line BL towards a low logical value. At the same time, node NDB and bit line ZBL each have a high logical value. Bit line ZBL therefore stays at the high logical value. Because bit line BL transitions towards a low logical value and bit line ZBL stays at the high logical value, a bit line split between bit lines BL and ZBL and between bit lines BLSA and ZBLSA develops.

In operation 435, when the bit line split of bit lines BLZA and ZBLSA is sufficient large, sense amplifier 105 in FIG. 1 is turned on to sense the bit line split and recognizes the transition of bit line BL indicative of a low logical value in node ND and a high logical value in node NDB. In other words, sense amplifier 105 reads the low logical value stored in node ND and the high logical value in node NDB.

In the above illustration, when node ND stores a high logical value, node NDB stores a low logical value. Sensing or reading node NDB having a low logical value indicates a high logical value in node ND. Sensing node NDB having a low logical value based on bit line ZBL is similar to sensing node ND having a low logical value based on bit line BL as explained above.

In the above illustration, by operations of NOR gate NOR122, AND gate AND124, inverter INV112, and inverter INV114, outputs O112 and O114 have a same high logical value. As a result, a leakage current of transistor N170 is about the same as that of transistor N180. Consequently, compared with the situation in which outputs O112 and O114 have a different logical value from one another, the effective offset of sense amplifier 105 is reduced. Further, sense amplifier 105 takes a smaller bit line split to produce the sensed result, and the sense speed is therefore improved. Transistors N170 and N180 each can have a larger size, which improves a write speed.

In FIGS. 3 and 4, FIG. 1A is used for illustration. Operations of circuit 100B in FIG. 1B is similar when circuit 198 causes outputs O112 and O114 to have an inverse logical value of one another in a write operation and to have a same logical value in a read operation are within the scope of various embodiments.

In some embodiments, a memory circuit includes a memory cell and a data circuit. In a write operation of the memory cell, the data circuit is configured to provide a first write logical value to the first output of the data circuit and to provide a second write logical value to the second output of the data circuit. The first write logical value is different from the second write logical value. In a read operation of the memory cell, the data circuit is configured to provide a same logical value to the first output and the second output of the data circuit.

In some embodiments, a memory circuit includes a memory cell, a first data line, a second data line, a first write switching circuit, a second write switching circuit, a first read switching circuit, a second read switching circuit, a sense amplifier, and a data circuit. The first data line is associated with a first node of the memory cell, and is coupled with a first terminal of the first write switching circuit and a first terminal of the first read switching circuit. A second terminal of the first write switching circuit is coupled with a first output of the data circuit. A second terminal of the first read switching circuit is coupled with a first terminal of the sense amplifier. The second data line is associated with a second node of the memory cell, and is coupled with a first terminal of the second write switching circuit and a first terminal of the second read switching circuit. A second terminal of the second write switching circuit is coupled with a second output of the data circuit. A second terminal of the second read switching circuit is coupled with a second terminal of the sense amplifier. In a write operation of the memory cell, the data circuit is configured to provide a first write logical value to the first output of the data circuit and to provide a second write logical value to the second output of the data circuit. The second write logical value is different from the first write logical value. In a read operation of the memory cell, the data circuit is configured to provide a same logical value to the first output and the second output of the data circuit.

In some embodiments, in a write operation of a memory cell, a first write logical value is provided to a first node and a second write logical value is provided to a second node. The second logical value is different from the first logical value. In a read operation of the memory cell, a same logical value is provided to each of the first node and the second node. The first node is coupled with a first terminal of a first switching device. A second terminal of the first switching device is coupled with a first terminal of a second switching device and with a first data line associated with a first memory node of the memory cell. A second terminal of the second switching device is coupled with a first node of a sense amplifier.

A number of embodiments have been described. It will nevertheless be understood that various modifications may be made without departing from the spirit and scope of the disclosure. For example, various transistors are shown having a particular dopant type, e.g., N-type or P-type Metal Oxide Semiconductor (NMOS or PMOS). Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A memory circuit comprising:
a memory cell;
a first write switching circuit;
a first data line; and
a data circuit,
wherein
a first terminal of the first write switching circuit is coupled with a first output of the data circuit;
the first data line is associated with a first node of the memory cell and is coupled with a second terminal of the first write switching circuit;
in a write operation of the memory cell,
the data circuit is configured to provide a first write logical value to the first output of the data circuit and to provide a second write logical value to a second output of the data circuit; the first write logical value different from the second write logical value; and
the memory cell is configured to receive data from the first output and the second output as data to be written into the memory cell; and
in a read operation of the memory cell, the data circuit is configured to provide a same logical value to the first output and the second output of the data circuit, and the first data line is pre-charged to the same logical value in the read operation.

2. The memory circuit of claim 1, wherein
the memory circuit further comprises a second write switching circuit;
the first write switching circuit is configured to receive data on the first output and to transmit the received data on the first output to the first node of the memory cell; and
the second write switching circuit is configured to receive data on the second output and to transmit the received data on the second output to a second node of the memory cell.

3. The memory circuit of claim 2, wherein
the first write switching circuit includes a first NMOS transistor;
a first terminal of the first NMOS transistor is coupled with the first output;
a second terminal of the first NMOS transistor is coupled with the first data line associated with the first node of the memory cell;
the second write switching circuit includes a second NMOS transistor;
a first terminal of the second NMOS transistor is coupled with the second output; and
a second terminal of the second NMOS transistor is coupled with a second data line associated with the second node of the memory cell.

4. The memory circuit of claim 1, wherein
the first node of the memory cell is coupled with the first data line and is configured to store a first logical value; and
the second node of the memory cell is coupled with a second data line and is configured to store a second logical value that is a logical inverse of the first logical value.

5. The memory circuit of claim 1, wherein
the memory circuit further comprises a first read switching circuit and a second read switching circuit;
the first read switching circuit is coupled with the first data line associated with the first node of the memory cell and with a second data line associated with a first node of an amplifier used in the read operation of the memory cell; and
the second read switching circuit is coupled with a third data line associated with a second node of the memory cell and with a fourth data line associated with a second node of the amplifier.

6. The memory circuit of claim 5, wherein
the first read switching circuit includes a first PMOS transistor;
a first terminal of the first PMOS transistor is coupled with the first data line;
a second terminal of the first PMOS transistor is coupled with the second data line;
the second read switching circuit includes a second PMOS transistor;
a first terminal of the second PMOS transistor is coupled with the third data line; and
a second terminal of the second PMOS transistor is coupled with the fourth data line.

7. The memory circuit of claim 1, wherein
the data circuit comprises an AND gate and a NOR gate;
a first input of the AND gate is configured to receive a first data signal;
a second input of the AND gate is configured to receive a first control signal;
an output of the AND gate is coupled with a first input of the NOR gate and is configured to provide data for the first output of the data circuit;
a second input of the NOR gate is configured to receive a second control signal, the first control signal and the second control signal having an inverse logical value of one another; and
an output of the NOR gate is configured to provide data for the second output of the data circuit.

8. The memory circuit of claim 1, wherein
the data circuit comprises an AND gate, a NOR gate, a first inverter, and a second inverter;
a first input of the AND gate is configured to receive a first data signal;
a second input of the AND gate is configured to receive a first control signal;
an output of the AND gate is coupled with a first input of the NOR gate and an input of the first inverter;
an output of the first inverter is configured to provide data for the first output of the data circuit;
a second input of the NOR gate is configured to receive a second control signal, the first control signal and the second control signal having an inverse logical value of one another;
an output of the NOR gate is coupled with an input of the second inverter; and
an output of the second inverter is configured to provide data for the second output of the data circuit.

9. A memory circuit comprising:
a memory cell;
a first data line and a second data line;
a first write switching circuit and a second write switching circuit;
a first read switching circuit and a second read switching circuit;
a sense amplifier; and
a data circuit,
wherein
the first data line is associated with a first node of the memory cell and is coupled with a first terminal of the first write switching circuit and a first terminal of the first read switching circuit;
a second terminal of the first write switching circuit is coupled with a first output of the data circuit;
a second terminal of the first read switching circuit is coupled with a first terminal of the sense amplifier;
the second data line is associated with a second node of the memory cell and is coupled with a first terminal of the second write switching circuit and a first terminal of the second read switching circuit;
a second terminal of the second write switching circuit is coupled with a second output of the data circuit;
a second terminal of the second read switching circuit is coupled with a second terminal of the sense amplifier;
in a write operation of the memory cell, the data circuit is configured to provide a first write logical value to the first output of the data circuit and to provide a second write logical value to the second output of the data circuit, the second write logical value is different from the first write logical value; and
in a read operation of the memory cell, the data circuit is configured to provide a same logical value to the first output and the second output of the data circuit, and the first data line and the second data line are configured to be pre-charged to the same logical value in the read operation.

10. The memory circuit of claim 9, wherein
the data circuit comprises an AND gate and a NOR gate;
a first input of the AND gate is configured to receive a first data signal;
a second input of the AND gate is configured to receive a first control signal;
an output of the AND gate is coupled with a first input of the NOR gate and is configured to provide data for the first output of the data circuit;
a second input of the NOR gate is configured to receive a second control signal, the first control signal and the second control signal having an inverse logical value of one another; and
an output of the NOR gate is configured to provide data for the second output of the data circuit.

11. The memory circuit of claim 9, wherein
the data circuit comprises an AND gate, a NOR gate, a first inverter, and a second inverter;
a first input of the AND gate is configured to receive a first data signal;
a second input of the AND gate is configured to receive a first control signal;
an output of the AND gate is coupled with a first input of the NOR gate and an input of the first inverter;
an output of the first inverter is configured to provide data for the first output of the data circuit;
a second input of the NOR gate is configured to receive a second control signal, the first control signal and the second control signal having an inverse logical value of one another;
an output of the NOR gate is coupled with an input of the second inverter; and
an output of the second inverter is configured to provide data for the second output of the data circuit.

12. The memory circuit of claim 9, wherein
the first write switching circuit includes a first NMOS transistor; and
the second write switching circuit includes a second NMOS transistor.

13. The memory circuit of claim 12, wherein
gates of the first NMOS transistor and the second NMOS transistor are configured to receive a same control signal.

14. The memory circuit of claim 9, wherein
the first read switching circuit includes a first PMOS transistor; and
the second read switching circuit includes a second PMOS transistor.

15. The memory circuit of claim 14, wherein
gates of the first PMOS transistor and the second PMOS transistor are configured to receive a same control signal.

16. A method comprising:
in a write operation of a memory cell, providing a first write logical value to a first node and a second write logical value to a second node, the second write logical value different from the first write logical value; and
in a read operation of the memory cell,
providing a same logical value to each of the first node and the second node; and
pre-charging a first data line associated with a first memory node of the memory cell to the same logical value,
wherein
the first node is coupled with a first terminal of a first switching device;
a second terminal of the first switching device is coupled with a first terminal of a second switching device and with the first data line; and
a second terminal of the second switching device is coupled with a first node of a sense amplifier.

17. The method of claim 16, wherein
the same logical value to each of the first node and the second node is a high logical value.

18. The method of claim 16, further comprising
in the write operation, turning on the first switching device and turning off the second switching device; and
in the read operation, turning off the first switching device and turning on the second switching device.

19. The method of claim 16, wherein
a third terminal of the first switching device is configured to receive a first control signal; and
a third terminal of the second switching device is configured to receive a second control signal.

20. The method of claim 16, further comprising
receiving data at a first input of an AND gate;
receiving a first control signal at a second input of the AND gate;
receiving a signal at an output of the AND gate as a first input of a NOR gate; and
receiving a second control signal at a second input of the NOR gate,
wherein,
in the read operation, a signal at an output of the NOR gate and the signal at the output of the AND gate provide the same logical value to each of the first node and the second node.

* * * * *